(12) United States Patent
Jin et al.

(10) Patent No.: US 11,014,461 B2
(45) Date of Patent: May 25, 2021

(54) CHARGE PORT CONTACTOR OPERATION

(71) Applicant: Ford Global Technologies, LLC, Dearborn, MI (US)

(72) Inventors: Ling Jin, Canton, MI (US); Navid Rahbari Asr, Livonia, MI (US); Carol Louise Okubo, Dearborn, MI (US); Yuan Zhang, Southgate, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 473 days.

(21) Appl. No.: 15/871,654

(22) Filed: Jan. 15, 2018

(65) Prior Publication Data
US 2019/0217712 A1 Jul. 18, 2019

(51) Int. Cl.
| B60R 22/00 | (2006.01) |
| B60L 53/16 | (2019.01) |
| B60L 3/12 | (2006.01) |
| G01R 31/387 | (2019.01) |
| G01R 31/367 | (2019.01) |
| B60L 58/12 | (2019.01) |
| B60L 3/00 | (2019.01) |
| G01R 31/00 | (2006.01) |

(52) U.S. Cl.
CPC ............ *B60L 53/16* (2019.02); *B60L 3/0046* (2013.01); *B60L 3/12* (2013.01); *B60L 58/12* (2019.02); *G01R 31/007* (2013.01); *G01R 31/367* (2019.01); *G01R 31/387* (2019.01); *B60L 2270/00* (2013.01)

(58) Field of Classification Search
CPC combination set(s) only.
See application file for complete search history.

(56) References Cited

U.S. PATENT DOCUMENTS

| 7,477,038 | B2 | 1/2009 | Taniguchi |
| 7,701,079 | B2 | 4/2010 | O'Gorman et al. |
| 9,190,855 | B2 | 11/2015 | White et al. |
| 2015/0353036 | A1 | 12/2015 | Pierce et al. |
| 2017/0028857 | A1* | 2/2017 | Gonzales ............... B60L 53/00 |
| 2017/0126026 | A1 | 5/2017 | Gema et al. |
| 2018/0194236 | A1* | 7/2018 | Elshaer ................ B60L 11/182 |
| 2019/0056453 | A1* | 2/2019 | Matsubara ......... G01R 19/0084 |

* cited by examiner

*Primary Examiner* — Adam M Alharbi
(74) *Attorney, Agent, or Firm* — Brooks Kushman PC; David Kelley

(57) ABSTRACT

A vehicle includes a contactor electrically between a charge port and a traction battery, and a controller configured to maintain the contactor in a closed position until a charge current estimate, derived from vehicle load data without sensing current through the contactor or receiving data from a charge station regarding the current, is less than a predetermined threshold. The maintenance of the contactor position is responsive to a charge disconnect request.

20 Claims, 4 Drawing Sheets

CHARGE PORT CONTACTOR OPERATION

TECHNICAL FIELD

The present disclosure relates to charge port operation for vehicles

BACKGROUND

Vehicles having electrical propulsion may be plugged in through charge ports to recharge depleted energy stores. For example, a plugin hybrid-electric vehicle may be plugged into a charging station to reenergize. While the vehicle is charging, the current passes from the charging station to the vehicle. Disconnection of the vehicle from the charging station while high current passes through the charge port may affect contactors of the charging port.

SUMMARY

A vehicle includes a contactor electrically between a charge port and a traction battery. The vehicle includes a controller configured to maintain the contactor in a closed position until a charge current estimate, derived from vehicle load data without sensing current through the contactor or receiving data from a charge station regarding the current, is less than a predetermined threshold. The maintenance of the contactor position is responsive to a charge disconnect request.

A method for a vehicle includes, responsive to a charge disconnect request, maintaining by a controller a contactor electrically between a charge port of the vehicle and a traction battery of the vehicle in a closed position until a charge current estimate, derived from load data of the vehicle without sensing current through the contactor or receiving data regarding the current from a charge station associated with the vehicle, is less than a predetermined threshold.

A vehicle includes a contactor electrically between a charge port and a traction battery. The vehicle includes a controller configured to open the contactor such that power transmission between the traction battery and the charge station is disabled. The opening is responsive to a charge disconnect request and a charge current estimate falling below a predetermined threshold derived from vehicle load data without sensing current through the contactor or receiving data from a charge station regarding the current.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

A charging station may provide indication of current transferred between itself and a vehicle while the vehicle is plugged in and charging. During a disconnect procedure, the vehicle may open a contactor configured to receive current from the charging station to stop the flow of electricity. In order to open the contactors, the vehicle may be required to have—through procurement or inference—its own charge current values during the disconnect procedure because this information is not always available during the disconnect procedure. Meaning, the vehicle must use its own—measurement or estimate—charge current value to enable opening of the contactor because the current value from the charge station is not available when the contactor disconnect procedure is occurring. Instead of adding an additional current sensor to perform this measurement during disconnection, the vehicle may estimate the current flowing through the contactor after a disconnection request is made.

Indeed, a vehicle controller may perform an estimate of the charge current by aggregating the auxiliary loads of the vehicle and the current flowing from the traction battery without measuring charge current directly or receiving it from the charging station. The aggregation of auxiliary loads may include error due to measurement uncertainty. Error compensation may be implemented through a feedback loop designed to compare the current estimate from the aggregation to the known current value from the charging station while the vehicle is charged. A learning algorithm may be used to improve the accuracy of the estimation during charging such that when a disconnection procedure occurs, a more accurate estimation is used, thus preventing welding or scarring of the contactor or delayed opening of the contactor.

Figure 1:
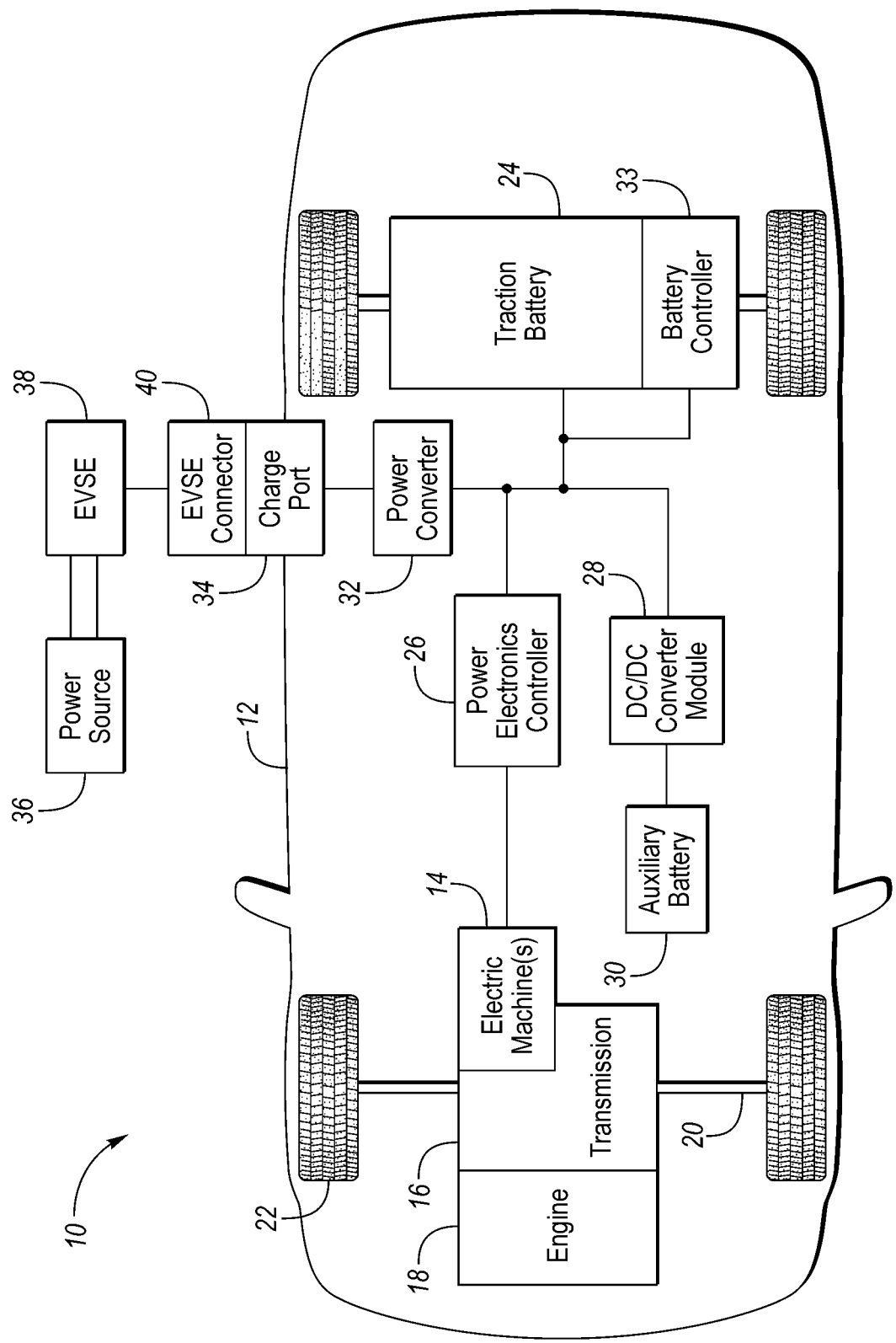
FIG. 1 is a system overview of a plugin vehicle.

FIG. 1 depicts a block diagram 10 illustrating a vehicle 12 comprising one or more electric machines 14 mechanically connected to a hybrid transmission 16. The electric machines 14 may be capable of operating as a motor or a generator. In addition, the hybrid transmission 16 may be mechanically connected to an engine 18. The hybrid transmission 16 may also be mechanically connected to a drive shaft 20 that is mechanically connected to the wheels 22. The electric machines 14 can provide propulsion and deceleration capability when the engine 18 is turned on or off. The electric machines 14 may also act as generators and may provide fuel economy benefits by recovering energy that would normally be lost as heat in the friction braking system. The electric machines 14 may also provide reduced pollutant emissions since the hybrid-electric vehicle 12 may be operated in electric mode or hybrid mode under certain conditions to reduce overall fuel consumption of the vehicle 12.

A traction battery (or battery pack) 24 stores and provides energy that may be used by the electric machines 14. The traction battery 24 may provide a high voltage DC output from one or more battery cell arrays, sometimes referred to as battery cell stacks, within the traction battery 24. The battery cell arrays may include one or more battery cells. The traction battery 24 may be electrically connected to one or more power electronics controllers 26 through one or more contactors (not shown). The one or more contactors isolate the traction battery 24 from other components when opened and connect the traction battery 24 to other components when closed.

The power electronics controller 26 may also be electrically connected to the electric machines 14 and may be configured to bi-directionally transfer electrical energy between the traction battery 24 and the electric machines 14. For example, the traction battery 24 may provide a DC voltage while the electric machines 14 may require a three-phase AC voltage to function. The power electronics controller 26 may convert the DC voltage to a three-phase AC voltage as required by the electric machines 14. In a regenerative mode, the power electronics controller 26 may convert the three-phase AC voltage from the electric machines 14 acting as generators to the DC voltage required by the traction battery 24. Portions of the description herein are equally applicable to a pure electric vehicle. For a pure electric vehicle, the hybrid transmission 16 may be a gear box connected to an electric machine 14 and the engine 18 may not be present.

In addition to providing energy for propulsion, the traction battery 24 may provide energy for other vehicle electrical systems. A DC/DC converter 28 may convert high voltage DC output of the traction battery 24 to a low voltage DC supply that is compatible with other vehicle loads. Other high-voltage loads, such as compressors and electric heaters, may be connected directly to the high-voltage without the use of the DC/DC converter 28. The low-voltage systems may be electrically connected to an auxiliary battery 30 (e.g., 12V battery).

A battery control module 33 may be in communication with the traction battery 24. The battery controller 33 may be configured to monitor and manage operation of the traction battery 24, such as via an electronic monitoring system (not shown) that manages temperature and charge state of each of the battery cells.

The vehicle 12 may be, for example, an electrified vehicle that includes components for a plug-in hybrid electric vehicle (PHEV), a full hybrid electric vehicle (FHEV), a mild hybrid electric vehicle (MHEV), or a battery electric vehicle (BEV). The traction battery 24 may be recharged by an external power source 36. The external power source 36 may be a connection to an electrical outlet. The external power source 36 may be electrically connected to electric vehicle supply equipment (EVSE) or charge station 38. The charge station 38 may provide circuitry and controls to regulate and manage the transfer of electrical energy between the power source 36 and the vehicle 12. The external power source 36 may provide DC or AC electric power to the charge station 38.

The charge station 38 may have a charge connector 40 for plugging into a charge port 34 of the vehicle 12. The charge port 34 may be any type of port configured to transfer power from the charge station 38 to the vehicle 12. The charge port 34 may be electrically connected to a charger or on-board power converter 32. The power converter 32 may condition the power supplied from the charge station 38 to provide the proper voltage and current levels to the traction battery 24. The power converter 32 may interface with the charge station 38 to coordinate the delivery of power to the vehicle 12. The charge station connector 40 may have pins that mate with corresponding recesses of the charge port 34.

Figure 2:
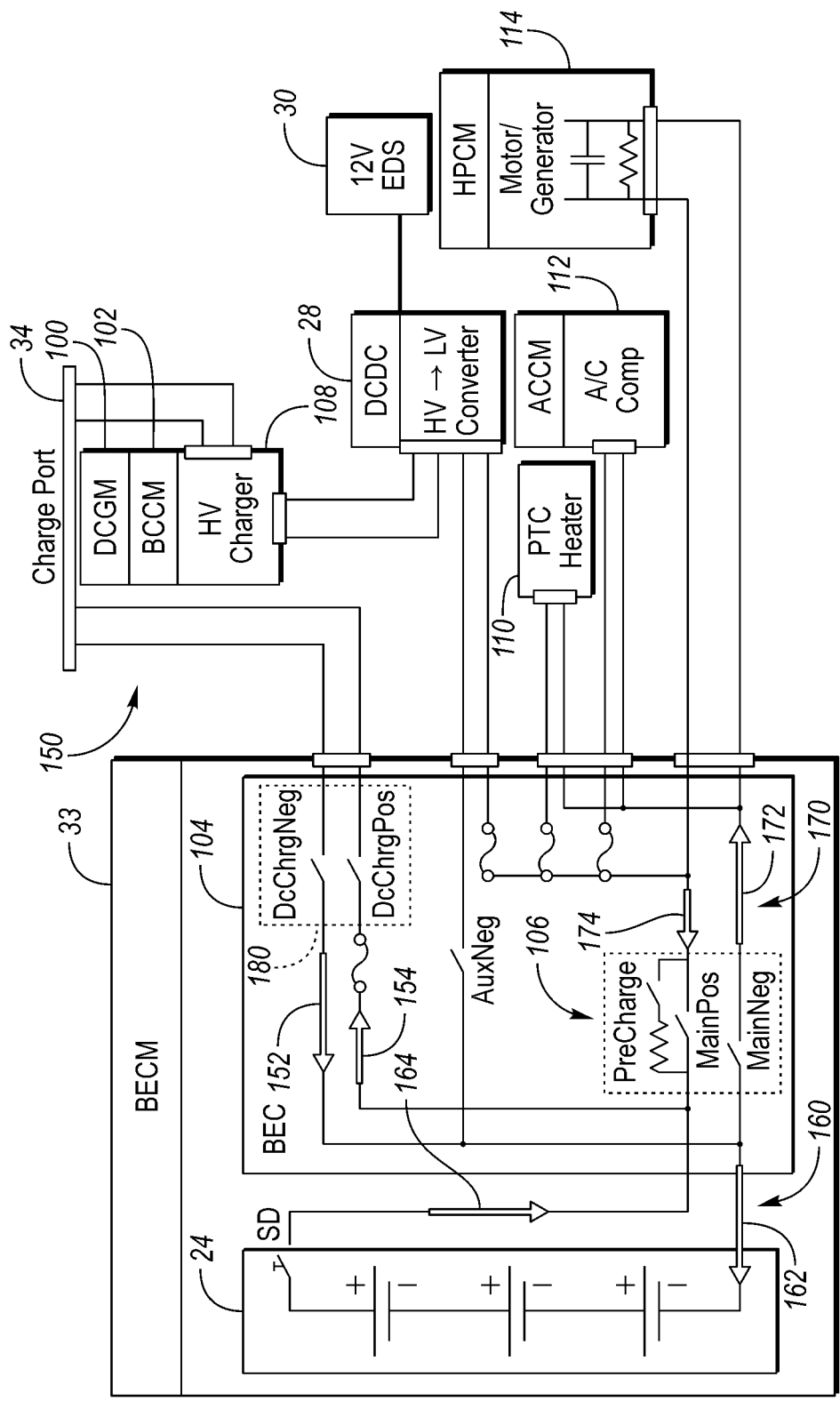
FIG. 2 is an overview of a high voltage system of a plugin vehicle.

Referring to FIG. 2, an electrical bus system of the vehicle 12 is shown. As current is drawn from the charging station through charge port 34, the battery control module 33 controls energy flowing into and out of the battery 24 through bus 150. The charge port 34 may comprise a digital communications gateway module (DCGM) 100 in communication with the charge station 16. The DCGM 100 may be configured to receive a signal indicative of a request to transfer electric energy between the charge station 38 and the battery pack 24 via an AC or a DC charging session. The DCGM 100 may also be in communication with the BCCM 102 in the case of AC charging. DCGM 100 communicates with the charging station through a medium for digital communications which can be Wi-Fi, Power Line Communications (PLC), Controller Area Network (CAN), etc. Digital communications may include information regarding the current received from the charge station 38."

The battery pack 24 may comprise one or more battery cells, a bussed electric center (BEC) 104, and a battery energy control module (BECM) 33. The BEC 104 may include a set of contactors 106 for connecting to an inverter and motor generator 114. The BEC 104 may further include a set of charging contactors 180 having positive and negative leads 152, 154 for connecting the battery 24 positive and negative leads 164, 162 and high voltage bus positive and negative leads 172, 170 to the charge station 38. The high voltage bus may include a PTC heater 110, an air conditioning compressor 112 and a motor generator 114. The high voltage bus may also include a high voltage to low voltage converter 28 and other low voltage loads 30. Each of these loads may be estimated or measured.

Figure 3:
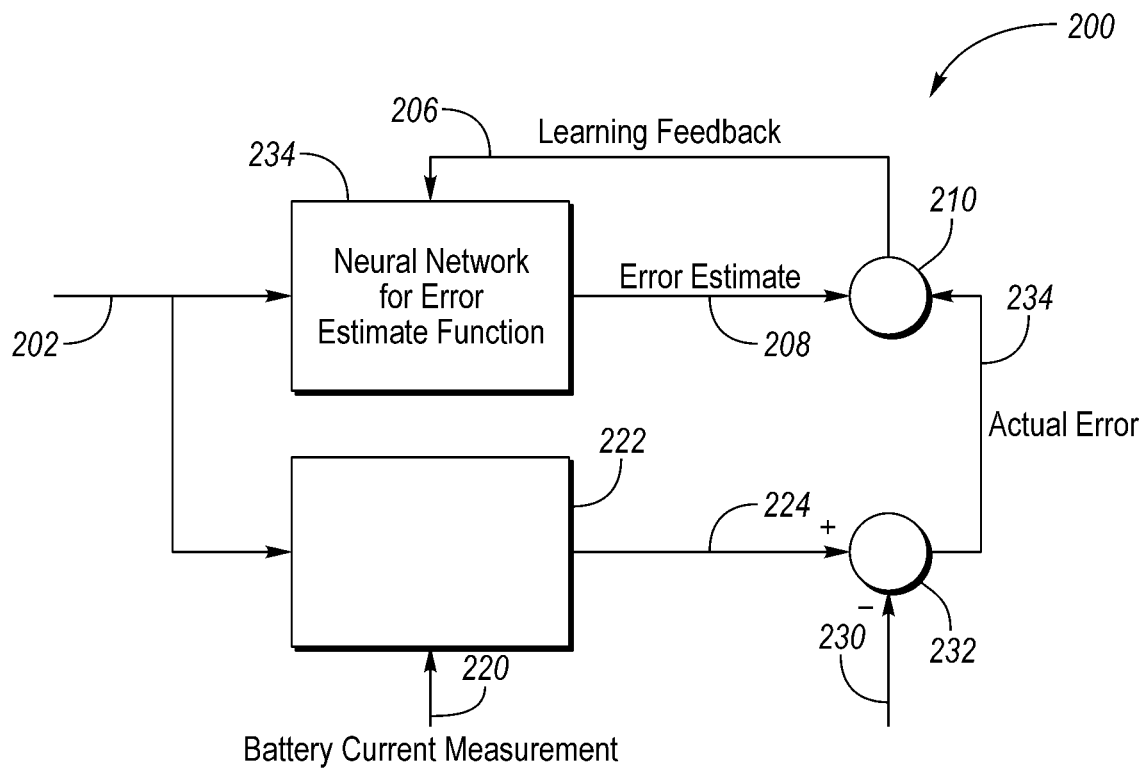
FIG. 3 is a function block diagram of a learning feedback loop for current estimation during battery charging.

Referring to FIG. 3, a function block diagram 200 is shown. The function block diagram 200 includes logic for error correction. The high voltage bus current estimate 202 is combined with the battery current measurement 220 in function block 222 to create the charge current estimate 224 using a nodal analysis method. Meaning, the battery current measurement 220 is subtracted from the high voltage bus current estimate 202. The actual charge current 230 from the charge station 38 is subtracted from the charge current estimate 224 to determine the actual error 234 of the charge current estimate. The high voltage bus current estimate 202 is also entered into a learning algorithm 204 to derive an error estimate 208. The actual error 234 is subtracted from the error estimate 208 to be entered into the learning algorithm 204 to update the error estimate based on the new error. The function block diagram 200 is continuously run to learn the error estimate function 208 while the vehicle is charged or while the vehicle 12 and charge station 38 are in a charge mode. The function block diagram 200 may be processed on any of the vehicle's controllers including the BECM 33, the DGCM 100, the BCCM 102, or another vehicle controller. In response to receiving a state of charge (SOC) full signal from the BECM 33 a disconnect request may be received.

Figure 4:
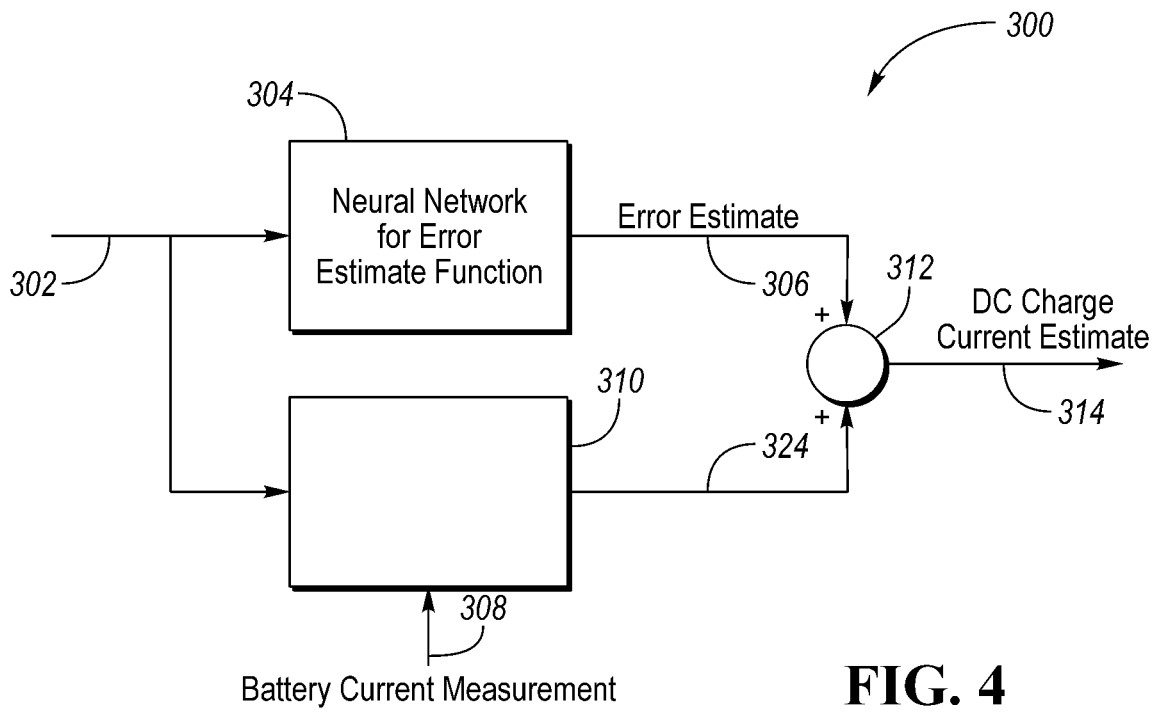
FIG. 4 is a function black diagram of a current estimation output after a disconnect request is received.

Upon receiving a disconnect request or before disconnection, the controller may use function block diagram 300 of FIG. 4. Function block diagram 300 ensures that the vehicle controllers use only vehicle generated information during the opening of the contactors 180. Function block diagram 300 includes the high voltage bus current estimate 302. The high voltage bus current estimate 302 is combined with the battery current measurement 308 in function block 310 to create the charge current estimate 324 using a nodal analysis method. Meaning, the battery current measurement 308 is subtracted from the high voltage bus current estimate 302. The charge current estimate 324 is corrected by the error estimate 306. The error estimate 306 is a function of the high voltage bus current estimate 302. The machine learning algorithm learns this function during vehicle charging and keeps adapting it to the latest operating/environmental conditions of the vehicle. This means that the error estimate is not constant because this function block 304 may include different error values for different bus current estimates under different operating/environmental conditions.

Figure 5:
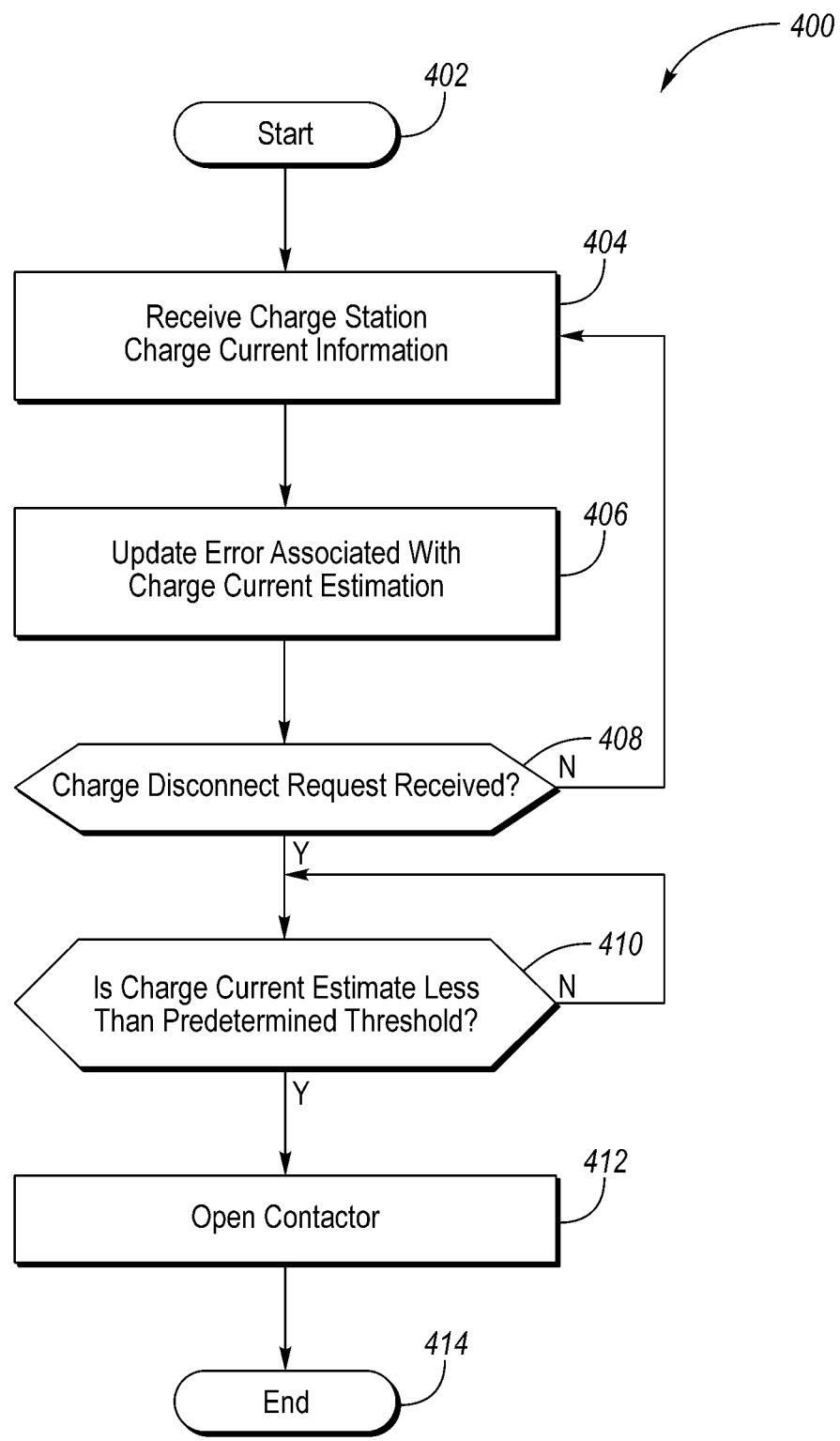
FIG. 5 is an algorithm for operation of a charge contactor.

Referring to FIG. 5, an algorithm 400 is shown. The algorithm starts in step 402. The algorithm may run during a charging evolution of the electric vehicle. Meaning, when the vehicle begins to charge, the algorithm 400 may be initiated. In step 404, the controller—or group of controllers—receives charge station charge current information. Meaning, the charge station sends charge current information to the controller through the charge port 34 or DCGM 100. In step 406, the error estimate 208 is updated as was described in FIG. 3. Steps 404 and 406 continue until a charge disconnect request is received in step 408. In step 408, the controller receives a charge disconnect request from one of the other controllers based on an SOC of the battery 24 or by user intervention.

If a disconnect request is received in step 408, the controller will determine whether the charge current estimate 314, with the included error is less than a predetermined threshold. The predetermined threshold may be set to a current rating of the charge contactor. For example, most circuit breakers have a current rating where repetitive operation is available without excessive arcing, scouring, or melting of the contactor. The predetermined threshold may be based on other factors. In alternative embodiments, the predetermined threshold may be adjusted by the error estimate 306 instead of the charge current estimate being adjusted by the error estimate 306. Thus, the contactor can be opened in step 412 without excessive arcing. In step 414, the algorithm ends.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle comprising:
a contactor electrically between a charge port and a traction battery; and
a controller configured to, responsive to a charge disconnect request, maintain the contactor in a closed position until a charge current estimate, derived from vehicle load data without sensing current through the contactor or receiving data from a charge station regarding the current, is less than a predetermined threshold.

2. The vehicle of claim 1, wherein the charge current estimate is further derived from a difference between a charge current reported by the charge station prior to the disconnect request and the charge current estimate prior to the disconnect request.

3. The vehicle of claim 2, wherein the charge current estimate further includes an error estimate and a feedback loop.

4. The vehicle of claim 3, wherein the error estimate is derived from a neural network.

5. The vehicle of claim 3, wherein the feedback loop is ignored responsive to the disconnect request.

6. The vehicle of claim 1, wherein the predetermined threshold is equal to a current rating of the contactor.

7. The vehicle of claim 1, wherein the disconnect request is based on a state of charge of the traction battery.

8. The vehicle of claim 1, wherein the charge current estimate is based on a summation of load indications drawing power from a high voltage bus associated with the charging port and the traction battery.

9. A method for a vehicle comprising:
responsive to a charge disconnect request, maintaining by a controller a contactor electrically between a charge port of the vehicle and a traction battery of the vehicle in a closed position until a charge current estimate, derived from load data of the vehicle without sensing current through the contactor or receiving data regarding the current from a charge station associated with the vehicle, is less than a predetermined threshold.

10. The method of claim 9, wherein the charge current estimate is further derived from a difference between a charge current reported by the charge station prior to the disconnect request and the charge current estimate prior to the disconnect request.

11. The method of claim 10, wherein the charge current estimate further includes an error estimate and a feedback loop.

12. The method of claim 11, wherein the error estimate is derived from a neural network.

13. The method of claim 9, wherein the predetermined threshold is equal to a current rating of the contactor.

14. The method of claim 9, wherein the disconnect request is based on a state of charge of the traction battery.

15. The method of claim 9, wherein the charge current estimate is based on a summation of loads drawing power from a high voltage bus associated with the charging port and the traction battery.

16. A vehicle comprising:
a contactor electrically between a charge port and a traction battery; and
a controller configured to, responsive to a charge disconnect request and a charge current estimate falling below a predetermined threshold derived from vehicle load data without sensing current through the contactor or receiving data from a charge station regarding the current, open the contactor such that power transmission between the traction battery and the charge station is disabled.

17. The vehicle of claim 16, wherein the charge current estimate is further derived from a difference between a charge current reported by the charge station prior to the disconnect request and the charge current estimate prior to the disconnect request.

18. The vehicle of claim 17, wherein the charge current estimate further includes an error estimate and a feedback loop.

19. The vehicle of claim 18, wherein the disconnect request is based on a state of charge of the traction battery.

20. The vehicle of claim 19, wherein the charge current estimate is based on a summation of load indications drawing power from a high voltage bus associated with the charging port and the traction battery.

\* \* \* \* \*